US008658540B2

(12) United States Patent
Huang et al.

(10) Patent No.: US 8,658,540 B2
(45) Date of Patent: Feb. 25, 2014

(54) METHODS FOR LOW TEMPERATURE CONDITIONING OF PROCESS CHAMBERS

(75) Inventors: Yi-Chiau Huang, Fremont, CA (US);
David K. Carlson, San Jose, CA (US);
Errol Antonio C. Sanchez, Tracy, CA (US); Zhiyuan Ye, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 260 days.

(21) Appl. No.: 13/156,082

(22) Filed: Jun. 8, 2011

(65) Prior Publication Data

US 2011/0306186 A1   Dec. 15, 2011

Related U.S. Application Data

(60) Provisional application No. 61/353,177, filed on Jun. 9, 2010.

(51) Int. Cl.
*H01L 21/306* (2006.01)
*B08B 6/00* (2006.01)
*B44C 1/22* (2006.01)

(52) U.S. Cl.
USPC .............................. 438/706; 134/1.3; 216/37

(58) Field of Classification Search
USPC ................................ 438/706; 134/1.3; 216/37
See application file for complete search history.

(56) References Cited

U.S. PATENT DOCUMENTS

| 5,421,957 | A | 6/1995 | Carlson et al. |
| 7,235,492 | B2 | 6/2007 | Samoilov |
| 7,509,962 | B2 * | 3/2009 | O'Meara et al. ............... 134/1.1 |
| 2003/0221708 | A1 * | 12/2003 | Ly et al. ......................... 134/18 |
| 2006/0169669 | A1 | 8/2006 | Zojaji et al. |
| 2007/0224830 | A1 | 9/2007 | Samoilov |

* cited by examiner

*Primary Examiner* — William D Coleman
(74) *Attorney, Agent, or Firm* — Moser Taboada; Alan Taboada

(57) ABSTRACT

Methods for removing residue from interior surfaces of process chambers are provided herein. In some embodiments, a method of conditioning interior surfaces of a process chamber may include maintaining a process chamber at a first pressure and at a first temperature of less than about 800 degrees Celsius; providing a process gas to the process chamber at the first pressure and the first temperature, wherein the process gas comprises chlorine and nitrogen to remove residue disposed on interior surfaces of the process chamber; and increasing the pressure in the process chamber from the first pressure to a second pressure while continuing to provide the process gas to the process chamber.

19 Claims, 2 Drawing Sheets

METHODS FOR LOW TEMPERATURE CONDITIONING OF PROCESS CHAMBERS

CROSS-REFERENCE TO RELATED APPLICATIONS

This application claims benefit of U.S. provisional patent application Ser. No. 61/353,177, filed Jun. 9, 2010, which is herein incorporated by reference.

FIELD

Embodiments of the present invention generally relate to a substrate processing.

BACKGROUND

Current semiconductor production typically requires periodic process chamber conditioning to remove contaminants, ensure uniformity and prevent process drift. Conventional chamber conditioning processes are typically performed at high temperatures, for example temperatures greater than about 1000 degrees Celsius. However, current semiconductor fabrication processes are performed at temperatures significantly lower than that of the conditioning process temperatures. As a result of that disparity, the temperature of the process chamber must be continuously increased and decreased, making the conditioning process slow and inefficient. In addition, the repetitive cycling of the process chamber heating elements necessary to achieve the different temperatures reduces the useful life of the process chamber heating elements.

Therefore, the inventors have provided improved methods for low temperature conditioning of interior surfaces of process chambers.

SUMMARY

Methods for conditioning interior surfaces of a process chamber are provided herein. In some embodiments, a method of conditioning interior surfaces of a process chamber may include maintaining a process chamber at a first pressure and at a first temperature of less than about 800 degrees Celsius; providing a process gas to the process chamber at the first pressure and the first temperature, wherein the process gas comprises chlorine and nitrogen to remove residue disposed on interior surfaces of the process chamber; and increasing the pressure in the process chamber from the first pressure to a second pressure while continuing to provide the process gas to the process chamber.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
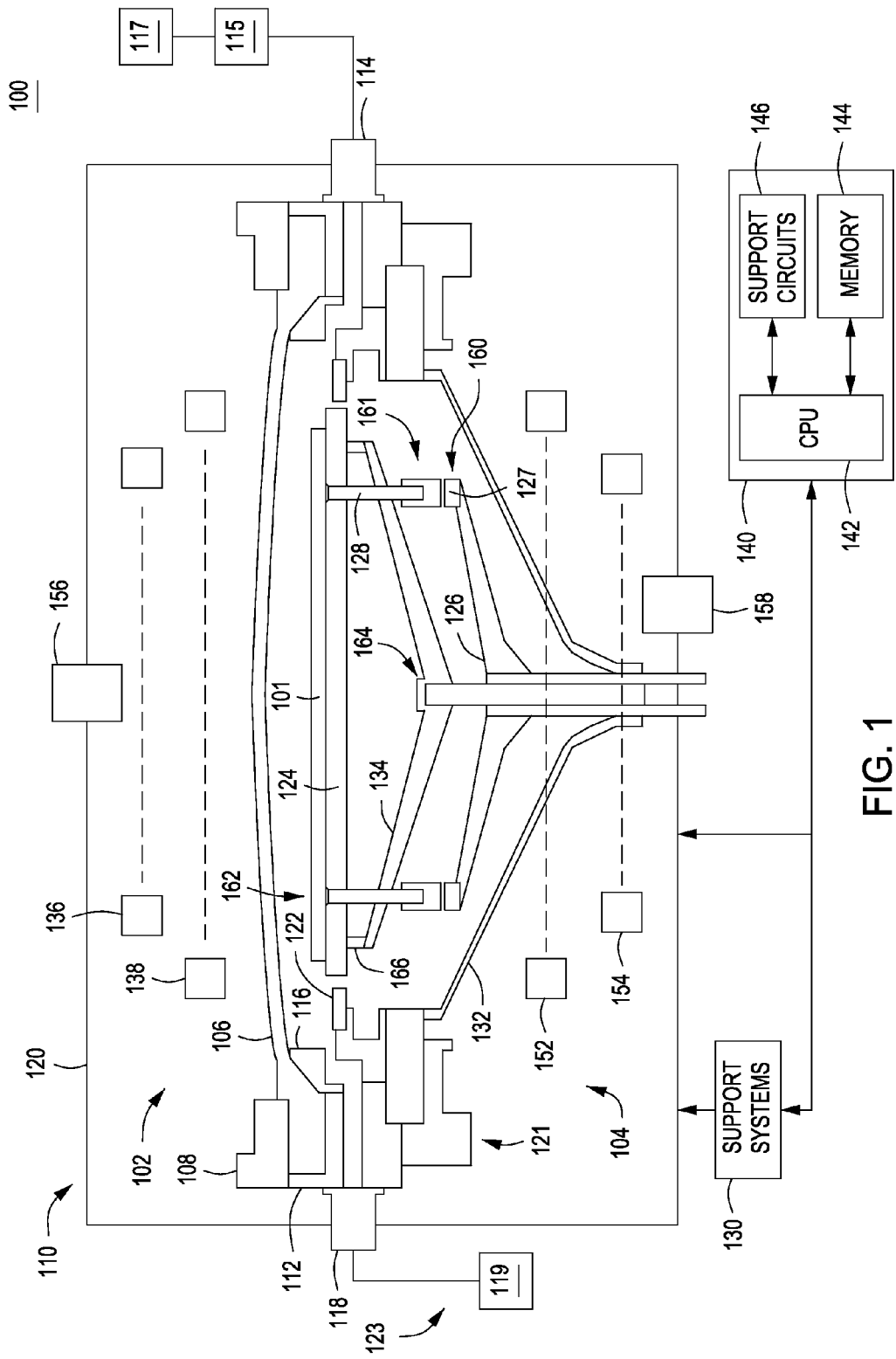
FIG. 1 depicts a process chamber suitable to perform the methods disclosed herein in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention may advantageously provide methods for conditioning interior surfaces of process chambers that remove residue at temperatures substantially similar to the process chamber processing temperature. In some embodiments, the inventive methods may also deposit a coating on interior surfaces of the process chamber at temperatures substantially similar to the process chamber processing temperature. The inventive methods may advantageously reduce process cycle time between conditioning and processing, thereby increasing temporal and energy efficiency, reducing energy consumption, and extending the useful life of chamber components.

Embodiments of the inventive methods disclosed herein may be used in any suitable process chamber, including those adapted for performing epitaxial deposition processes, such as the RP EPI reactor, available from Applied Materials, Inc. of Santa Clara, Calif. An exemplary process chamber is described below with respect to FIG. 1, which depicts a schematic, cross-sectional view of a semiconductor substrate process chamber 100 suitable for performing portions of the present invention. The process chamber 100 may be adapted for performing epitaxial deposition processes and illustratively comprises a chamber body 110, support systems 130, and a controller 140. The process chamber depicted in FIG. 1 is illustrative only and the present inventive methods may be used to advantage in other process chambers as well, including those configured for processes other than epitaxial deposition processes.

The chamber body 110 generally includes an upper portion 102, a lower portion 104, and an enclosure 120. A vacuum system 123 may be coupled to the chamber body 110 to facilitate maintaining a desired pressure within the chamber body 110. In some embodiments, the vacuum system 123 may comprise a throttle valve (not shown) and vacuum pump 119 which are used to exhaust the chamber body 110. In some embodiments, the pressure inside the chamber body 110 may be regulated by adjusting the throttle valve and/or vacuum pump 119. The upper portion 102 is disposed on the lower portion 104 and includes a lid 106, a clamp ring 108, a liner 116, a baseplate 112, one or more upper heating lamps 136 and one or more lower heating lamps 152, and an upper pyrometer 156. In some embodiments, the lid 106 has a dome-like form factor, however, lids having other form factors (e.g., flat or reverse curve lids) are also contemplated. The lower portion 104 is coupled to a process gas intake port 114 and an exhaust port 118 and comprises a baseplate assembly 121, a lower dome 132, a substrate support 124, a pre-heat ring 122, a substrate lift assembly 160, a substrate support assembly 164, one or more upper heating lamps 138 and one or more lower heating lamps 154, and a lower pyrometer 158. Although the term "ring" is used to describe certain components of the process chamber 100, such as the pre-heat ring 122, it is contemplated that the shape of these components need not be circular and may include any shape, including but not limited to, rectangles, polygons, ovals, and the like. A gas source 117 may be coupled to the chamber body 110 to provide one or more process gases thereto. In some embodiments, a purifier 115 may be coupled to the gas source 117 to filter or purify the one or more process gases prior to entering the chamber body 110.

During processing, the substrate 101 is disposed on the substrate support 124. The lamps 136, 138, 152, and 154 are sources of infrared (IR) radiation (i.e., heat) and, in operation, generate a pre-determined temperature distribution across the substrate 101. The lid 106, the clamp ring 108, and the lower dome 132 are formed from quartz; however, other IR-transparent and process compatible materials may also be used to form these components.

The substrate support assembly 164 generally includes a support bracket 134 having a plurality of support pins 166 coupled to the substrate support 124. The substrate lift assembly 160 comprises a substrate lift shaft 126 and a plurality of lift pin modules 161 selectively resting on respective pads 127 of the substrate lift shaft 126. In one embodiment, a lift pin module 161 comprises an optional upper portion of the lift pin 128 is movably disposed through a first opening 162 in the substrate support 124. In operation, the substrate lift shaft 126 is moved to engage the lift pins 128. When engaged, the lift pins 128 may raise the substrate 101 above the substrate support 124 or lower the substrate 101 onto the substrate support 124.

The support systems 130 include components used to execute and monitor pre-determined processes (e.g., growing epitaxial films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 may be provided and coupled to the process chamber 100 for controlling the components of the process chamber 100. The controller 140 may be any suitable controller for controlling the operation of a substrate process chamber. The controller 140 generally comprises a Central Processing Unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems.

The CPU 142 may be any form of a general purpose computer processor that can be used in an industrial setting. The support circuits 146 are coupled to the CPU 142 and may comprise cache, clock circuits, input/output subsystems, power supplies, and the like. Software routines, such as the methods for processing substrates disclosed herein, for example with respect to FIG. 2 below, may be stored in the memory 144 of the controller 140. The software routines, when executed by the CPU 142, transform the CPU 142 into a specific purpose computer (controller) 140. The software routines may also be stored and/or executed by a second controller (not shown) that is located remotely from the controller 140. Alternatively or in combination, in some embodiments, for example where the process chamber 100 is part of a multi-chamber processing system, each process chamber of the multi-chamber processing system may have its own controller for controlling portions of the inventive methods disclosed herein that may be performed in that particular process chamber. In such embodiments, the individual controllers may be configured similar to the controller 140 and may be coupled to the controller 140 to synchronize operation of the process chamber 100.

Figure 2:
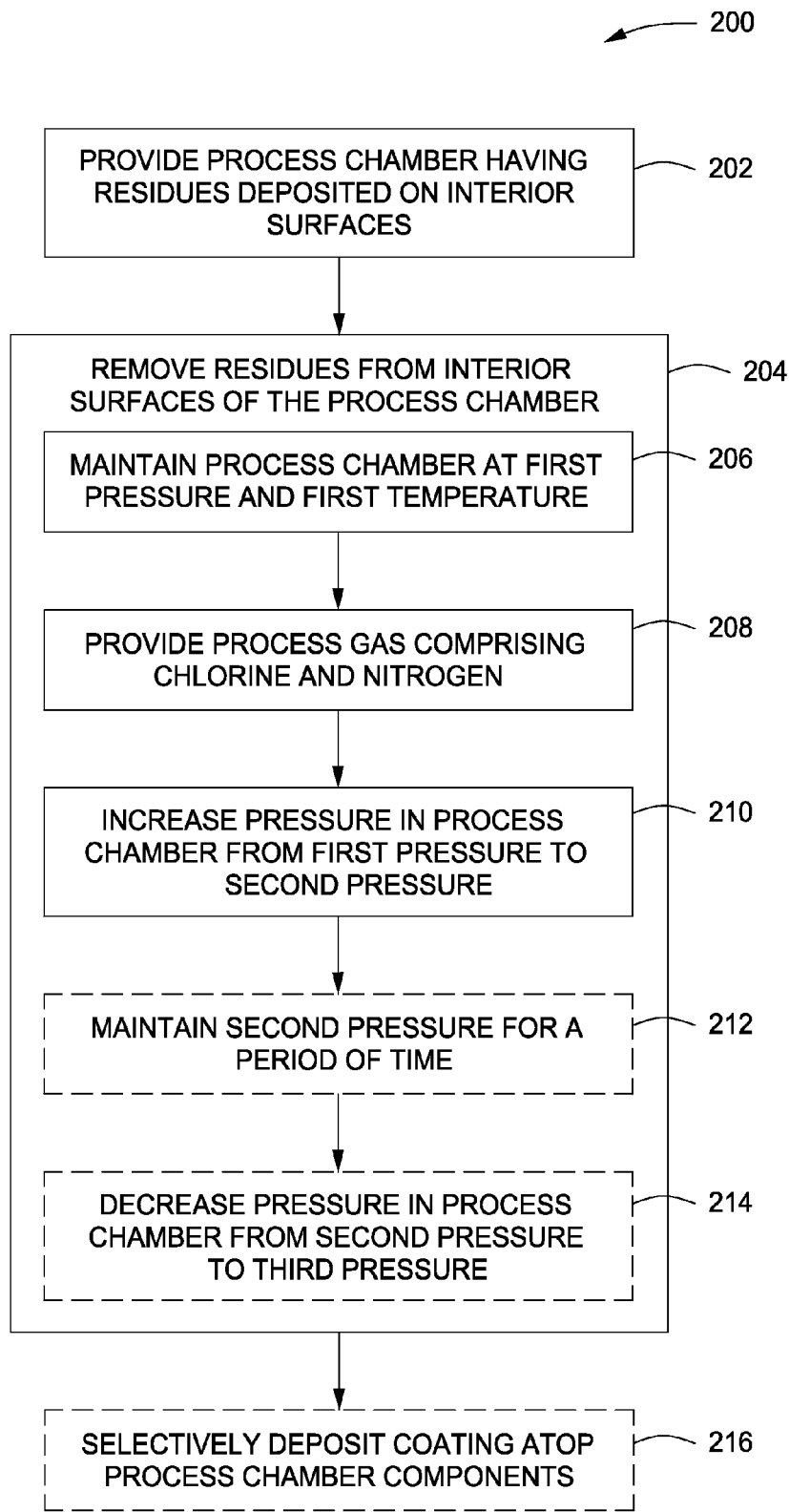
FIG. 2 is a method for conditioning a process chamber in accordance with some embodiments of the present invention.

FIG. 2 is a method for conditioning a process chamber in accordance with some embodiments of the present invention. The method may be performed in any type of process chamber suitable for substrate processing, for example, such as the process chamber 100 described above with respect to FIG. 1.

The method 200 generally begins at 202 where a process chamber is provided. In some embodiments, the process chamber may have residue deposited on interior surfaces of the process chamber (such as the chamber wall, substrate support, process kits, and the like). The process chamber may be any process chamber suitable for substrate processing for example, such as the process chamber 100 described above with respect to FIG. 1.

The residue may be any residue formed as a result of any processes performed within the process chamber (including prior chamber seasoning or conditioning processes). For example, in some embodiments, the residue may comprise at least one of silicon containing or germanium containing residue. Alternatively, or in combination, in some embodiments, for example where a doping process is performed in the process chamber, the residue may comprise components from the dopants, such as boron (B), phosphorous (P), carbon (C), or the like. The process performed in the chamber may be any process suitable for substrate fabrication, for example, deposition, etching, annealing, or the like. For example, in some embodiments, the process may be an epitaxial deposition or growth process. In some embodiments, the substrate is removed from the process chamber prior to performing residue removal process described below.

The residue may be formed on any of the on the interior surfaces of the process chamber. For example, in embodiments where the process chamber is similar to the process chamber 100 described above, residue may be deposited anywhere within the chamber body 110, for example, such as the pre-heat ring 122, lid 106, lower dome 132, substrate support assembly 164, liners 116, or the like.

Next, at 204 the residue is removed from the interior surfaces of the process chamber. In some embodiments, to more effectively remove the residues from the interior surfaces of the process chamber without interference, the residue removal process may be performed with no substrate present in the process chamber. To begin the residue removal process, in some embodiments, as shown at 206, the process chamber may be first provided, or maintained, at a first temperature and first pressure. In some embodiments, the first temperature may be any temperature, for example, less than about 800 degrees Celsius, or in some embodiments about 700 degrees Celsius. In some embodiments, the temperature can be as low as 400 to 500 degrees Celsius. In such embodiments, maintaining the temperature at less than about 800 degrees Celsius may reduce or eliminate damage to chamber components (e.g., quartz ($SiO_2$) based components) due to an overly aggressive etch reaction when using some etchant gases, for example, such as chlorine ($Cl_2$).

In some embodiments, the first temperature may be substantially similar to a processing temperature used during a process performed prior to and/or after performing the residue removal. For example, in some embodiments, the first temperature may be about 50 degrees Celsius greater than, or in some embodiments, less than the process temperature. In such embodiments, maintaining the first temperature at a temperature substantially similar to the prior processing temperature allows the heating elements of the process chamber (e.g., upper heating lamps 136 and lower heating lamps 152 as described above) to be maintained at a substantially constant temperature, thereby reducing the amount of heating and cooling cycles of the heating element. Reducing the amount of heating and cooling cycles provides for an energy and time efficient process and increases the useful life span of the heating elements.

In some embodiments, the first pressure may be any pressure for example, such as about 10 Torr to about 40 Torr, or in some embodiments, greater than about 10 Torr. In some embodiments, the first pressure and first temperature do not need to be maintained for any particular amount of time, and the process may proceed immediately to any subsequent steps, such as 208. In some embodiments, for example, the first pressure and first temperature may be maintained for about 1 to about 60 seconds, or about 10 to about 60 seconds, or in some embodiments, up to about 30 seconds.

Next, at 208, a process gas comprising chlorine ($Cl_2$) and nitrogen ($N_2$) may be provided to the process chamber. The process gas etches the residue disposed atop the interior surfaces, thereby facilitating removal of the residue. In some embodiments, the etching of the residue is facilitated via a thermal chemical process (e.g., the process gas is maintained in a non-plasma state). In some embodiments, the process gas may be provided to the process chamber via a gas source coupled to the process chamber at a total flow rate of about 3000 to about 10000 sccm, or about 7000 sccm. Although 206 and 208 are shown as separate steps of the method 200, in some embodiments, 206 and 208 may be performed simultaneously. For example, in some embodiments, the process gas comprising chlorine and ($Cl_2$) and nitrogen ($N_2$) may be provided to the process chamber while maintaining the process chamber at the pressures discussed above.

In some embodiments, the process gas comprises purified chlorine to reduce an amount of moisture (i.e., water) contained with the process gas. For example, in some embodiments, the chlorine may be purified such that there is about 1 to 10 parts per billion (ppb), or in some embodiments, less than a part per trillion (ppt) of water. When present, the purified chlorine may minimize contaminant introduction into the process chamber, thereby minimizing damage to process chamber components. In some embodiments, the chlorine may be filtered through a purifier (e.g., purifier 115 described above in FIG. 1) coupled to the to process chamber to facilitate providing the purified chlorine.

The chlorine ($Cl_2$) component of the process gas facilitates the etching of the residue disposed atop the interior surfaces of the process chamber and the nitrogen ($N_2$) acts as a carrier to facilitate delivery of the chlorine ($Cl_2$) throughout the process chamber. In addition, in some embodiments, the nitrogen ($N_2$) dilutes the chlorine ($Cl_2$) to prevent etching the process chamber components. In some embodiments, the process gas may comprise about 1 to about 10 percent chlorine ($Cl_2$). Accordingly, in such embodiments, the process gas may comprise about 99 to about 90 percent nitrogen ($N_2$). For example, in some embodiments, the process gas may comprise about 4 percent ($Cl_2$) and about 96 percent ($N_2$).

Next, at 210 the pressure within the process chamber is increased from the first pressure to a second pressure. The increase in pressure allows for substantially the entire chamber volume to be filled with the process gas, thereby facilitating a complete removal of residue from all chamber components. For example, in embodiments where a substrate susceptor is disposed within the process chamber (e.g., such as in the process chamber 100 described above), the increase in pressure allows for an etch of residue disposed atop the top and bottom surfaces of the substrate susceptor. In some embodiments, the second pressure may be about 160 to about 300 Torr, or in some embodiments, less than about 200 Torr. Providing the second pressure in the aforementioned range may facilitate a sufficient etch rate of the residue species. For example, in embodiments where the residue comprises silicon containing or germanium containing residue, the residue may be etched at about 1000 to about 4000 Angstroms per minute (Å/min), or in some embodiments about 2,460 (Å/min), or in some embodiments 2,575 (Å/min), or in some embodiments 2,625 (Å/min).

In some embodiments, to facilitate increasing the pressure from the first pressure to the second pressure, the process chamber may be isolated (i.e., closing a valve, for example the throttle valve of vacuum system 123 of process chamber 100 described above)) and process gas flowed until the desired second pressure is reached. For example, in some embodiments, a rate of the increase (the ramp rate) from the first pressure to the second pressure may provide an adequate amount of force to cause a valve (e.g., a throttle valve) to close, thereby isolating the process chamber. In such embodiments, the ramp rate may be about 5 to about 10 Torr per second, or in some embodiments up to about 30 Torr per second. Increasing the pressure via flow of process gas allows for substantially the entire chamber volume to be filled with the process gas, thereby facilitating a complete removal of residue from all chamber components. In some embodiments, the pressure may be increased over a first period of time, for example, suitable to reach the second pressure and promote a complete etching of all components. In some embodiments, the pressure within the process chamber may be increased from the first pressure to the second pressure over a first period of time of about 30 to about 45 seconds.

Next, at 212, the second pressure may optionally be maintained for a second period of time. The second period of time may be any amount of time to allow for sufficient removal of the residue disposed atop the interior surfaces of the process chamber. For example, in some embodiments, the second period of time may be up to about 10 seconds.

Next, at 214, the pressure in the process chamber may optionally be decreased from the second pressure to a third pressure. In some embodiments, the third pressure may be any pressure for example, such as about 10 to about 40 Torr, or in some embodiments, greater than about 10 Torr.

Next, at 216, a coating may be optionally selectively deposited atop process chamber components. In some embodiments, the coating may settle or immobilize any remaining residue particulates, thereby reducing contamination during subsequent processes performed in the chamber. In some embodiments, the coating may be selectively deposited atop any of the components disposed within the process chamber. For example, in embodiments where the process chamber is similar to process chamber 100 described above, the coating may be deposited atop at least one of a susceptor or pre-heat ring disposed within the process chamber. In some embodiments, the coating may have an emissivity substantially similar to the emissivity of materials being deposited in a subsequent process performed in the process chamber. In such embodiments, the emissivity of the coating may be adjusted by varying the thickness or composition of the coating.

In some embodiments, to deposit the coating one or more process gases may be provided to the process chamber and maintained at a desired pressure and temperature. A thermal chemical reaction may occur, thereby causing material to be deposited atop the process chamber components. In some embodiments, the one or more process gases may comprise one of silane ($SiH_4$), disilane ($Si_2H_6$), germane ($GeH_4$) or higher order hydrides thereof. In some embodiments, the process gas may be provided to the process chamber at a flow rate of about 200 to about 600 sccm. In some embodiments, a carrier gas may be provided to facilitate uniform delivery of the one or more process gases. For example, in some embodiments, the carrier gas may comprise a hydrogen containing gas, for example, such as hydrogen ($H_2$), ammonia ($NH_3$), or the like. In some embodiments, the one or more process gases and carrier gas may be provided to the process chamber at a process gases to carrier gas flow rate ratio of about 1:100 to about 3:100.

In addition to the above, additional process parameters may be utilized to facilitate the deposition. For example, in some embodiments, the process chamber may be maintained at a pressure of about 40 to about 200 Torr, or in some embodiments, about 80 Torr. In addition, in some embodiments, the process chamber may be maintained at a temperature of less than about 800 degrees Celsius, or in some embodiments, about 300 to about 800 degrees Celsius, or in some embodiments, about 750 degrees Celsius. Maintaining the temperature at less that about 800 degrees, may facilitate control over one or more properties, for example emissivity, of the coating, thereby providing a repeatable process and reducing contaminant levels (e.g., particles, chlorine ($Cl_2$), oxygen ($O_2$), metals, etc.) in subsequent substrate processing.

In some embodiments, the temperature may be substantially similar to the temperature used in the residue removal process. For example, in some embodiments, the temperature may be about 50 degrees Celsius great than, or in some embodiments, less than the temperature used in the residue removal process. In such embodiments, maintaining the first temperature at a temperature substantially similar to the prior temperature allows the heating elements of the process chamber to be maintained at a substantially constant temperature, thereby reducing the amount of heating element heating and cooling cycles. Reducing the amount of heating and cooling cycles provides for an energy and time efficient process and increases the useful life span of the process chamber heating elements. In some embodiments, to ensure the coating materials are not deposited atop the process chamber walls, the process chamber walls may be maintained at a different temperature than that of the deposition temperature.

After depositing the coating at 216, the method generally ends and subsequent processes may be performed in the process chamber. For example, in some embodiments, a substrate may be provided to the process chamber for one or more fabrication processes, such as an epitaxial deposition process. In some embodiments, a plurality of substrates may be sequentially processed with the chamber conditioning process performed between every substrate, or after some desired number of substrates have been processed. For example in some embodiments, a first process may be performed on a first substrate, the first substrate may be removed from the process chamber upon completion of the first process, a chamber conditioning process may be performed in accordance with any of the embodiments as described above, a second substrate may be provided to the process chamber and a second process may be performed on the second substrate. The second process may be the same or different than the first process. This cycle may continue, alternating processing substrates and conditioning the process chamber, to facilitate more uniform processing of each substrate.

Thus, methods of low temperature conditioning of process chambers are provided herein. The inventive methods may advantageously provide a method of conditioning a process chamber that removes residue and optionally deposits a coating at a temperature substantially similar to the process chamber processing temperature, thereby increasing efficiency, reducing energy consumption and extending the useful life of chamber components.

While the foregoing is directed to embodiments of the present invention, other and further embodiments of the invention may be devised without departing from the basic scope thereof.

The invention claimed is:

1. A method of conditioning interior surfaces of a process chamber, comprising:
   maintaining a process chamber at a first pressure and at a first temperature of less than about 800 degrees Celsius;
   providing a process gas to the process chamber at the first pressure and the first temperature, wherein the process gas comprises about 1 to about 10 percent chlorine ($Cl_2$) and about 99 to about 90 percent nitrogen ($N_2$) by volume to remove residue disposed on interior surfaces of the process chamber; and
   increasing the pressure in the process chamber from the first pressure to a second pressure while continuing to provide the process gas to the process chamber.

2. The method of claim 1, wherein maintaining the process chamber at the first pressure comprises:
   maintaining the process chamber at the first pressure of about 10 to about 40 Torr.

3. The method of claim 1, wherein maintaining the process chamber at the first pressure comprises:
   maintaining the process chamber at the first pressure for a duration of about 1 to about 60 seconds.

4. The method of claim 1, wherein providing the process gas comprises providing the process gas at a flow rate of about 3000 to about 10000 sccm.

5. The method of claim 1, wherein the process gas consists essentially of chlorine ($Cl_2$) and nitrogen ($N_2$).

6. The method of claim 1, wherein the process gas is maintained in a non-plasma state.

7. The method of claim 1, wherein increasing the pressure in the process chamber further comprises:
   ramping the pressure in the process chamber from the first pressure to the second pressure over a time period of about 35 to about 45 seconds.

8. The method of claim 1, further comprising:
   maintaining the pressure in the process chamber at the second pressure for a duration of up to about 10 seconds.

9. The method of claim 1, wherein the second pressure is about 160 to about 300 Torr.

10. The method of claim 1, further comprising:
    decreasing the pressure in the process chamber from the second pressure to a third pressure, wherein the third pressure is about 10 to about 40 Torr.

11. The method of claim 1, wherein the interior surfaces of the process chamber include at least one of a susceptor or a pre-heat ring disposed within the process chamber.

12. The method of claim 1, further comprising:
    subsequent to removing residue disposed on interior surfaces of the process chamber, depositing a coating comprising at least one of silicon or germanium atop one or more components of the process chamber while maintaining the process chamber at a second temperature of about 300 to about 800 degrees Celsius.

13. The method of claim 1, wherein the residue comprises at least one of silicon (Si) and germanium (Ge).

14. The method of claim 6, wherein the chlorine gas comprises about 1 to about 10 parts per billion of water.

15. The method of claim 6, wherein the chlorine gas comprises less than about 1 part per trillion of water.

16. The method of claim 12, wherein the one or more components comprise at least one of a susceptor and heating ring disposed within the process chamber.

17. The method of claim 12, wherein a difference between the first temperature and second temperature is less than about 50 degrees Celsius.

18. The method of claim 12, wherein the coating is deposited via chemical vapor deposition.

19. The method of claim 12, further comprising either or both of:
- performing an epitaxial deposition process prior to providing the process gas to the process chamber; and
- performing an epitaxial deposition process after depositing the coating.

* * * * *